United States Patent
Iwamizu

(10) Patent No.: US 10,418,336 B2
(45) Date of Patent: Sep. 17, 2019

(54) MANUFACTURING METHOD OF SEMICONDUCTOR DEVICE AND SEMICONDUCTOR DEVICE

(71) Applicant: FUJI ELECTRIC CO., LTD., Kanagawa (JP)

(72) Inventor: Morio Iwamizu, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/885,837

(22) Filed: Feb. 1, 2018

(65) Prior Publication Data
US 2018/0269163 A1   Sep. 20, 2018

(30) Foreign Application Priority Data
Mar. 14, 2017  (JP) ................. 2017-048959

(51) Int. Cl.
*H01L 23/00* (2006.01)
*H01L 21/768* (2006.01)
(Continued)

(52) U.S. Cl.
CPC ........ *H01L 23/562* (2013.01); *H01L 21/3212* (2013.01); *H01L 21/32133* (2013.01); *H01L 21/7684* (2013.01); *H01L 21/76802* (2013.01); *H01L 21/76843* (2013.01); *H01L 21/76877* (2013.01); *H01L 21/823475* (2013.01); *H01L 24/03* (2013.01); *H01L 24/05* (2013.01); *H01L 24/48* (2013.01); *H01L 27/06* (2013.01); *H01L 27/0617* (2013.01); *H01L 29/45* (2013.01); *H01L 21/28568* (2013.01); *H01L 29/0696* (2013.01); *H01L 29/4236* (2013.01); *H01L 29/7397* (2013.01); *H01L 29/7813* (2013.01); *H01L 29/7827* (2013.01); *H01L 2224/03614* (2013.01); *H01L 2224/03616* (2013.01); *H01L 2224/04042* (2013.01); *H01L 2224/05082* (2013.01); *H01L 2224/05184* (2013.01); *H01L 2224/05573* (2013.01); *H01L 2224/05624* (2013.01); *H01L 2224/05647* (2013.01); *H01L 2224/45124* (2013.01); *H01L 2224/45144* (2013.01); *H01L 2224/45147* (2013.01);
(Continued)

(58) Field of Classification Search
CPC ..................................... H01L 29/456
USPC ....................... 257/751, 763, 770
See application file for complete search history.

(56) References Cited

U.S. PATENT DOCUMENTS 6,503,803 B2 * 1/2003 Todorobaru .......... H01L 23/485
257/E23.019

FOREIGN PATENT DOCUMENTS

JP   H5-160133 A   6/1993
JP   H6-29409 A    2/1994
(Continued)

*Primary Examiner* — Mark V Prenty

(57) ABSTRACT

To protect the insulating film so that crack is not produced in the insulating film even when stress is applied to the semiconductor device. A manufacturing method of a semiconductor device is provided, including: forming an insulating film above a semiconductor substrate; forming, in the insulating film, one or more openings that expose the semiconductor substrate; forming a tungsten portion deposited in the openings and above the insulating film; thinning the tungsten portion on condition that the tungsten portion remains in at least part of a region above the insulating film; and forming an upper electrode above the tungsten portion.

10 Claims, 18 Drawing Sheets

(51) Int. Cl.
*H01L 21/3213* (2006.01)
*H01L 21/321* (2006.01)
*H01L 29/45* (2006.01)
*H01L 27/06* (2006.01)
*H01L 21/8234* (2006.01)
*H01L 21/285* (2006.01)
*H01L 29/739* (2006.01)
*H01L 29/06* (2006.01)
*H01L 29/78* (2006.01)
*H01L 29/423* (2006.01)

(52) U.S. Cl.
CPC ............... *H01L 2224/48463* (2013.01); *H01L 2924/04941* (2013.01); *H01L 2924/13055* (2013.01); *H01L 2924/3511* (2013.01); *H01L 2924/3512* (2013.01)

(56) References Cited

FOREIGN PATENT DOCUMENTS

| | | |
|---|---|---|
| JP | H6-314722 A | 11/1994 |
| JP | H11-126776 A | 5/1999 |
| JP | 2000-100816 A | 4/2000 |
| JP | 2005-302752 A | 10/2005 |

* cited by examiner

MANUFACTURING METHOD OF SEMICONDUCTOR DEVICE AND SEMICONDUCTOR DEVICE

The contents of the following Japanese patent application are incorporated herein by reference:

NO. 2017-048959 filed on Mar. 14, 2017.

BACKGROUND

1. Technical Field

The present invention relates to a manufacturing method of a semiconductor device and a semiconductor device.

2. Related Art

Conventionally, manufacturing methods of semiconductor devices including tungsten plugs have been known (see Patent Documents 1-3, for example). In an example of a manufacturing method, an insulating film having openings is formed on a semiconductor substrate. Then, a tungsten film is deposited to fill the openings and cover the insulating film from above. Subsequently, the tungsten film other than the filling portion is completely removed by etchback. In this manner, tungsten plugs is formed having a structure in which the openings are filled with tungsten. An upper electrode is formed above the tungsten plugs and the insulating film.

Patent Document 1: Japanese Patent Application Publication No. 2005-302752

Patent Document 2: Japanese Patent Application Publication No. Hei. 6-29409

Patent Document 3: Japanese Patent Application Publication No. Hei. 5-160133

In some cases, stress may be applied to the semiconductor device from above such as when wiring is bonded to the upper electrode. It is desirable to protect the insulating film so that crack is not produced in the insulating film even when stress is applied to the semiconductor device. However, thickening the upper electrode to protect the insulating film may result in increased warping of the semiconductor wafer during the manufacturing process.

SUMMARY

A first aspect of the present invention provides a manufacturing method of a semiconductor device. The manufacturing method of a semiconductor device may include forming an insulating film above a semiconductor substrate. The manufacturing method may include forming, in the insulating film, one or more openings that expose the semiconductor substrate. The manufacturing method may include forming a tungsten portion deposited in the openings and above the insulating film. The manufacturing method may include thinning the tungsten portion on condition that the tungsten portion remains in at least part of a region above the insulating film. The manufacturing method may include forming an upper electrode above the tungsten portion.

Thinning the tungsten portion may include: etching an upper surface of the tungsten portion; or planarizing an upper surface of the tungsten portion by chemical mechanical polishing.

The openings may include a first opening and a second opening that each expose the semiconductor substrate. In thinning the tungsten portion, the tungsten portion may remain above an entire part of the insulating film between the first opening and the second opening.

A second aspect of the present invention provides a semiconductor device. The semiconductor device may include a semiconductor substrate, an insulating film, tungsten portion and an upper electrode. The insulating film may be provided on the semiconductor substrate. The insulating film may have one or more openings that expose the semiconductor substrate. The tungsten portion may fill the openings and be provided in at least part of a region above the insulating film. The upper electrode may be provided above the tungsten portion.

The openings may include a first opening and a second opening that each expose the semiconductor substrate. The tungsten portion may be provided above an entire part of the insulating film between the first opening and the second opening.

The semiconductor device may further include a barrier metal portion. The barrier metal portion may be provided on a bottom portion and a side portion of the openings. The barrier metal portion may have one or more types of films that are laminated.

The barrier metal portion may also be provided on an upper surface of the insulating film. The tungsten portion may be provided in contact with an upper surface of the barrier metal portion. The upper electrode may be provided in contact with an upper surface of the tungsten portion.

A thickness of the tungsten portion in a region above the insulating film may be greater than a thickness of the barrier metal portion.

The upper electrode may include a wire-bonding region to which wiring is bonded. The tungsten portion may be provided at least below the wire-bonding region.

A power element portion and a control circuit portion may be provided to the semiconductor substrate. In the power element portion, the tungsten portion may be provided in at least part of a region above the insulating film. In the control circuit portion, the tungsten portion may not be provided above the insulating film.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
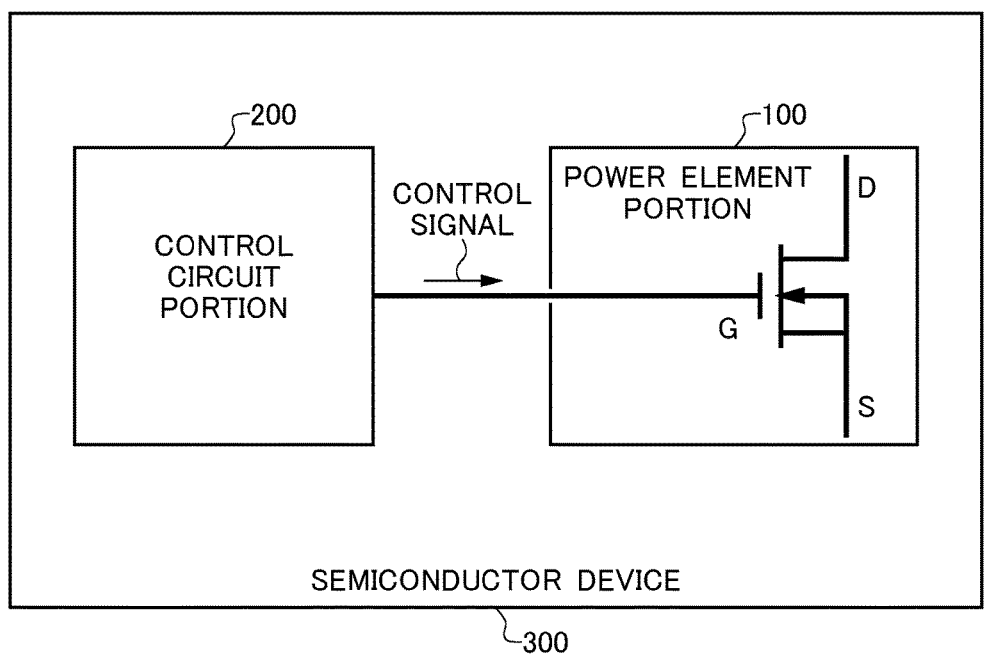
FIG. 1 is a schematic view showing a semiconductor device 300.

FIG. 1 is a schematic view showing a semiconductor device 300. The semiconductor device 300 includes a power element portion 100. The semiconductor device 300 in the present example includes a power element portion 100 and a control circuit portion 200. The semiconductor device 300 in the present example is a so-called "Intelligent Power Switch", in which the power element portion 100 and the control circuit portion 200 are integrated to a single semiconductor substrate. The power element portion 100 and the control circuit portion 200 provided to the semiconductor substrate may each have structures formed in the semiconductor substrate and structures formed on the semiconductor substrate. Providing the power element portion 100 and the control circuit portion 200 to a single semiconductor substrate allows the semiconductor device 300 to be made smaller compared to the case where the power element portion 100 and the control circuit portion 200 are provided to respectively different chips.

The power element portion 100 in the present example has a function to pass a large current from the drain (D) to the source (S). The control circuit portion 200 has a function to control the operation of the power element portion 100. The control circuit portion 200 in the present example has a function to control the gate (G) of the power element portion 100 to be turned on and off by sending a control signal to the power element portion 100. For example, the control circuit portion 200 includes a logic circuit, a level shift circuit and a driver circuit. Also, the control circuit portion 200 may have a function to sense abnormality in the power element portion 100. For example, the control circuit portion 200 has an overheat detecting function, an overcurrent detecting function, an overvoltage detecting function, a short circuit detecting function, and a protection circuit function. In this manner, the operation reliability of the power element portion 100 can be enhanced.

Figure 2:
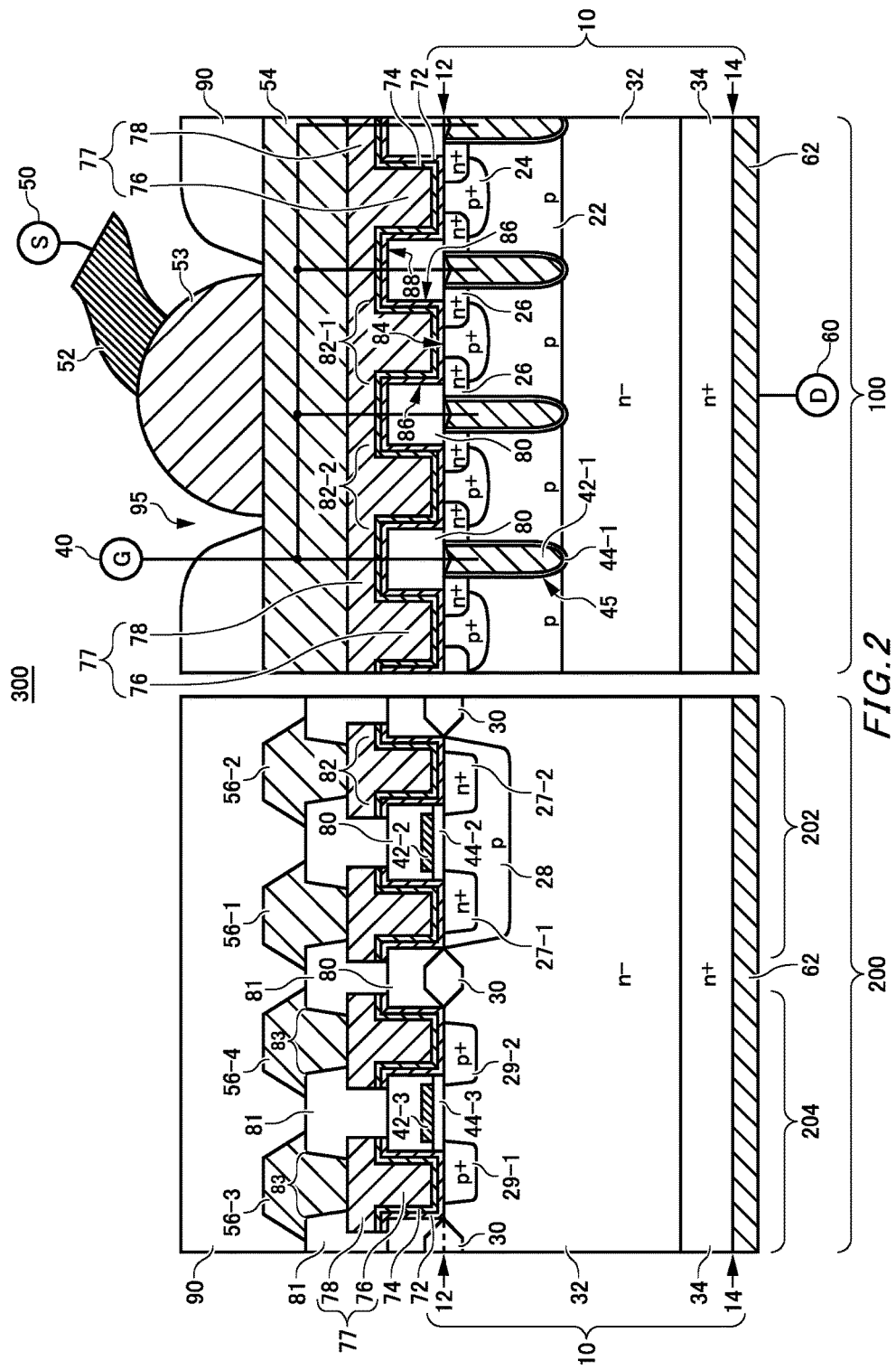
FIG. 2 is a cross-sectional view of the semiconductor device 300 in a first embodiment.

FIG. 2 is a cross-sectional view of the semiconductor device 300 in a first embodiment. FIG. 2 shows part of cross sections of the power element portion 100 and the control circuit portion 200. As described above, the power element portion 100 and the control circuit portion 200 are provided to a shared semiconductor substrate 10.

The power element portion 100 in the present example is a trench-gate vertical MOSFET (Metal Oxide Semiconductor Field Effect Transistor). The power element portion 100 in the present example includes a semiconductor substrate 10, an upper electrode 54, a drain electrode 62, a titanium (hereinafter referred to as Ti) film 72, a titanium nitride (hereinafter referred to as TiN) film 74, a tungsten portion 77, an insulating film 80 and a passivation film 90. A gate electrode 42 and a gate insulating film 44 are provided in the semiconductor substrate 10.

Also, in the present example, a solder 53 and a wire 52 are provided in an opening 95 of the passivation film 90. The wire 52 may be any type of wiring. The region of the upper electrode 54 exposed at the opening 95 may be a wire-bonding region. The wire 52 may be bonded to the wire-bonding region. The power element portion 100 is a trench-gate vertical MOSFET in the present example, but may also be a planar-gate vertical MOSFET. Also, as described later, the power element portion 100 is not limited to a MOSFET. The power element portion 100 may be an IGBT (Insulated Gate Bipolar Transistor).

The semiconductor substrate 10 in the present example is a silicon (hereinafter referred to as Si) substrate. In another example, the semiconductor substrate 10 may be a substrate of compound semiconductor such as silicon carbide (SiC). In the present example, one of the principal surfaces of the semiconductor substrate 10 is referred to as a front surface 12, and the other principal surface opposite to the one principal surface is referred to as a back surface 14. Note that, in the present example, the direction from the back surface 14 toward the front surface 12 is referred to as an "upward" direction and the opposite direction is referred to as a "downward" direction for the sake of convenience.

The semiconductor substrate 10 in the present example includes a drain region 34 on the back surface 14 side. The drain region 34 has a predetermined thickness measured in the upward direction from the back surface 14. The drain region 34 in the present example is an $n^+$-type region. In the present example, the letter n indicates that electron is the majority carrier and the letter p indicates that hole is the majority carrier. Also, the letter "n" or "p" may be accompanied by the superscript "+" or "−" at its right side. The letter with "+" indicates a higher carrier concentration than the letter without "+", while the letter with "−" indicates a lower carrier concentration than the letter without "−".

The semiconductor substrate 10 in the present example includes a drift region 32 on the drain region 34. The drift region 32 has a predetermined thickness measured in the upward direction from the boundary with the drain region 34. The drift region 32 in the present example is provided extending from the boundary with the drain region 34 to a base region 22. The drain region 34 in the present example is an $n^−$-type region.

The semiconductor substrate 10 in the present example includes a base region 22 on the drift region 32. The base region 22 has a predetermined thickness measured in the downward direction from the front surface 12. The base region 22 in the present example is provided extending from the front surface 12 to the boundary with the drift region 32. The base region 22 in the present example is a p-type region.

The semiconductor substrate 10 in the present example includes a trench portion 45. The trench portion 45 includes a trench provided to the semiconductor substrate 10, a gate insulating film 44, and a gate electrode 42 filling the trench. The trench in the present example extends from the front surface 12, penetrates the base region 22 and reaches the drift region 32. The gate insulating film 44 in the present example directly contacts the bottom and side portions of the trench. The gate insulating film 44 may contain silicon dioxide (hereinafter referred to as $SiO_2$). The gate electrode 42 in the present example directly contacts the gate insulating film 44. The gate electrode 42 may contain polysilicon.

The semiconductor substrate 10 in the present example includes a source region 26. At least part of the source region 26 is exposed at the front surface 12. The source region 26 may provide a conduction path having low resistance to electron current flowing in the MOSFET. The source region 26 in the present example is an $n^+$-type region. The source region 26 may be provided to surround the trench portion 45. In FIG. 2, a pair of source regions 26 is provided to directly contact the side portions of the trench portion 45 and to sandwich the trench portion 45. Note that, if trench portions 45 are provided in a striped manner in the direction perpendicular to the sheet, the source regions 26 may annularly surround the trench portion 45.

The semiconductor substrate 10 in the present example includes a contact region 24. At least part of the contact region 24 is exposed at the front surface 12. The contact resistance between the contact region 24 and metal may be lower than the contact resistance between intrinsic semiconductor and metal and the contact resistance between an n-type impurity region and metal. The contact region 24 in the present example is a p$^+$-type region. The contact region 24 in the present example is provided between a pair of source regions 26.

The insulating film 80 may be provided on the trench portion 45 in the semiconductor substrate 10. The insulating film 80 may be an interlayer insulating film. The insulating film 80 in the present example has one or more openings 82 that expose the contact region 24 and the source region 26. The insulating film 80 in the present example is BPSG (Boro-phospho Silicon Glass). The insulating film 80 may be BSG (borosilicate glass) or PSG (Phosphosilicate glass).

A barrier metal portion having one or more types of films that are laminated may be provided in the opening 82 of the insulating film 80. In the present example, the barrier metal portion has a laminated film of the Ti film 72 and the TiN film 74. The Ti film 72 and the TiN film 74 may be provided to have conforming shapes in the opening 82 of the insulating film 80.

The Ti film 72 of the barrier metal portion may have a function to prevent Al in the upper electrode 54 and Si in the semiconductor substrate 10 from reacting with each other. Also, the Ti film 72 may have a function to reduce the contact resistance between the barrier metal portion and both of the contact region 24 and the source region 26 compared to the case where the barrier metal portion is a single film of the TiN film 74.

For example, the TiN film 74 of the barrier metal portion has a function to prevent the electromigration (hereinafter referred to as EM) of metal atoms (Al, Si, or Cu in the present example) contained in the upper electrode 54, moving downward due to current flowing in metal wiring such as the upper electrode 54. Also, in annealing or the like in hydrogen, the Ti film 72 and the TiN film of the barrier metal portion 74 may occlude hydrogen to prevent hydrogen from moving into the insulating film 80 of BPSG or the like.

The Ti film 72 in the present example is provided to directly contact a bottom portion 84 of the opening 82 (that is, the front surface 12) and a side portion of the opening 82 (that is, a side surface 86 of the insulating film 80). Further, the Ti film 72 in the present example is provided to directly contact an upper surface 88 of the insulating film 80. In addition, the TiN film 74 in the present example directly contacts the Ti film 72 provided on the bottom portion 84. The TiN film 74 in the present example directly contacts the surface of the Ti film 72 opposite to the side surface 86 of the insulating film 80. Further, the TiN film 74 in the present example directly contacts the Ti film 72 provided on the insulating film 80.

The tungsten portion 77 in the present example is not only provided in the opening 82, but also extends to at least part of a region above the insulating film 80. That is, the tungsten portion 77 is provided filling the opening 82 and is also provided above the insulating film 80. Specifically, the tungsten portion 77 includes a tungsten plug portion 76 and a tungsten film 78. The tungsten plug portion 76 is provided in the opening 82. The tungsten film 78 is provided above the insulating film 80. The tungsten film 78 extends over the tungsten plug portion 76 and is integrally coupled with the tungsten plug portion 76. The tungsten film 78 provided above the insulating film 80 protects the insulating film 80 from the stress applied from above during wire-bonding or the like.

In the opening 82, the tungsten plug portion 76 may directly contact the TiN film 74. That is, in the present example, the opening 82 of the insulating film 80 is filled with the Ti film 72, the TiN film 74 and the tungsten plug portion 76.

Openings 82 of the insulating film 80 may be provided corresponding to the shape of contact regions 24 in top view. If the contact regions 24 are provided in a striped manner in top view, the openings 82 may also be provided in a striped manner in top view. If the contact regions 24 are provided in a dotted manner in top view, the openings 82 may also be provided in a dotted manner in top view. Certainly, the barrier metal portion and the tungsten plug portion 76 may be provided corresponding to the shape of the openings 82. A plurality of openings 82 may be arranged at a predetermined interval. The plurality of openings 82 includes a first opening 82-1 and a second opening 82-2 adjacent to each other. The first opening 82-1 and the second opening 82-2 each expose the semiconductor substrate 10.

The tungsten film 78 is provided above the entire part of the insulating film 80 between the first opening 82-1 and the second opening 82-2. In the present example, the Ti film 72 and the TiN film 74 are provided, as the barrier metal portion, on the upper surface 88 of the insulating film 80. Accordingly, the tungsten film 78 is provided in contact with the upper surface of the barrier metal portion. In the present example, the tungsten film 78 is provided in contact with the upper surface of the TiN film 74. The thickness of the tungsten portion 77 in a region above the insulating film 80 may be greater than the thickness of the barrier metal portion. Specifically, the thickness of the tungsten film 78 may be greater than the total thickness of the Ti film 72 and the TiN film 74. Thickness may refer to the thickness measured along the direction perpendicular to the front surface 12 of the semiconductor substrate 10.

The electric resistance of the tungsten portion 77 is higher than the electric resistance of the upper electrode 54 containing Al or Cu as its main component, and therefore it is desirable not to form the tungsten portion 77 to have an excessively large thickness in view of reducing the electric resistance. On the other hand, in order to protect the insulating film 80, it is desirable not to form the tungsten portion 77 to have an excessively small thickness. In an example, the tungsten film 78 may have a thickness, measured upward from the upper surface 88 of the insulating film 80, of 10 nm or more and 1 µm or less, preferably 0.1 µm or more and 0.5 µm or less, and more preferably 0.2 µm or more and 0.3 µm or less.

The tungsten film 78 constituting the tungsten portion 77 may be provided above the insulating film 80 over the entire region of the power element portion 100. Note that the tungsten film 78 constituting the tungsten portion 77 may be provided only in a corresponding region below the wire-bonding region of the upper electrode 54 exposed at the opening 95. The tungsten film 78 may be provided above the insulating film 80 overlapping at least the opening 95 in top view. Top view refers to the view of the power element portion 100 as seen from above the front surface 12 in the direction perpendicular to the front surface 12. The tungsten film 78 may not be provided above the insulating film 80 not overlapping the opening 95 in top view. Note that the tungsten plug portion 76 may be provided over the entire region of the power element portion 100.

The upper electrode 54 is provided above the tungsten portion 77. In the present example, the upper electrode 54 is provided in direct contact with the upper surface of the tungsten portion 77. Note that another film of conductive material may intervene between the upper electrode 54 and the upper surface of the tungsten portion 77. The upper electrode 54 may be an alloy containing aluminium (Al) as its main component such as Al—Si, or may be an alloy containing copper (Cu) as its main component. The upper electrode 54 in the present example is an Al—Si—Cu alloy.

In the present example, the tungsten portion 77 is provided not only in the opening 82 but also above the insulating film 80. The insulating film 80 is covered with the tungsten portion 77 having a higher hardness than the insulating film 80 and the upper electrode 54. The tungsten portion 77 mitigates the effect of the stress on the insulating film 80 that is locally applied to the insulating film 80 when the wire 52 is bonded to the upper electrode 54. Accordingly, crack in the insulating film 80 can be prevented from being produced. In this manner, the operation reliability of the semiconductor device 300 can be enhanced.

The tungsten portion 77 can protect the insulating film 80, and therefore the insulating film 80 can be protected without thickening the upper electrode 54. Accordingly, warping of the semiconductor wafer during the manufacturing process due to the thickened upper electrode 54 can be mitigated. Also, the material of the upper electrode 54 can be reduced.

Particularly, in the present example where the Ti film 72 is provided on the upper surface 88 of the insulating film 80 containing oxygen, the oxygen contained in the insulating film 80 and the Ti film 72 may react to produce a titanium dioxide (hereinafter referred to as $TiO_2$) film. In this manner, adhesiveness between the $TiO_2$ film and the insulating film 80 may be lowered. Accordingly, the upper electrode 54 is likely to peel off the insulating film 80 when stress is applied to the upper surface of the insulating film 80. However, according to the present example, the tungsten film 78 extends to a region above the insulating film 80, and therefore the effect of the stress on the insulating film 80 that is locally applied to the insulating film 80 can be mitigated. Accordingly, the upper electrode 54 can be prevented from peeling off the insulating film 80. In this manner, the operation reliability of the semiconductor device 300 can be enhanced compared to the case where the tungsten film 78 is not provided on the insulating film 80.

In the present example, the tungsten film 78 is also provided between the upper surface 88 of the insulating film 80 and the upper electrode 54. In this manner, deformation of the insulating film 80 due to temperature cycling during operation of the semiconductor device 300 can be prevented.

The passivation film 90 is provided on the upper electrode 54. The passivation film 90 has an opening 95 for allowing electrical conduction between the solder 53 and the upper electrode 54. As described above, the wire 52 may be bonded to the upper electrode 54 in wire-bonding, or may be electrically connected to the upper electrode 54 via the solder 53. The wire 52 may be a gold (Au) wire or a Cu wire. The wire 52 may also be an Al wire, an alloy wire containing Al or an alloy wire containing Cu.

The circled letter G in FIG. 2 refers to a gate portion 40 and corresponds to the letter G in FIG. 1. Similarly, the circled letter S and the circled letter D refer to, respectively, a source portion 50 and a drain portion 60. The source portion 50 and the drain portion 60 correspond to, respectively, the letter S and the letter D in FIG. 1.

The control circuit portion 200 in the present example is a planar-gate lateral MOSFET. The control circuit portion 200 in the present example includes a semiconductor substrate 10, a gate insulating film 44, a gate electrode 42, a wiring layer 56, a drain electrode 62, a Ti film 72, a TiN film 74, a tungsten plug portion 76, a tungsten film 78, an insulating film 80, an insulating film 81 and a passivation film 90. The control circuit portion 200 and the power element portion 100 are electrically separated from each other by a separation region 30 provided to the front surface 12 of the semiconductor substrate 10. For the control circuit portion 200, description is omitted regarding the same structures as those of the power element portion 100.

The control circuit portion 200 in the present example includes at least an NMOS region 202 and a PMOS region 204. The NMOS region 202 and the PMOS region 204 are part of the control circuit portion 200. The NMOS region 202 and the PMOS region 204 in the present example are electrically separated from each other by the separation region 30 positioned therebetween.

The semiconductor substrate 10 in the NMOS region 202 includes an $n^+$-type well region 27 and a p-type well region 28. The $n^+$-type well region 27 and the p-type well region 28 are each exposed at the front surface 12. In the p-type well region 28, two $n^+$-type well regions 27 are provided being spaced apart from each other. One of the two $n^+$-type well regions 27 functions as a source region, and the other functions as a drain region. The p-type well region 28 provided between the two $n^+$-type well regions 27 and below a gate electrode 42-2 functions as a channel-forming region.

The semiconductor substrate 10 in the PMOS region 204 includes a $p^+$-type well region 29. The $p^+$-type well region 29 is exposed at the front surface 12. In the $n^-$-type drift region 32, two $p^+$-type well regions 29 are provided being spaced apart from each other. One of the two $p^+$-type well regions 29 functions as a source region, and the other functions as a drain region. The $n^-$-type drift region 32 provided between the two $p^+$-type well regions 29 and below a gate electrode 42-3 functions as a channel-forming region.

The control circuit portion 200 may be driven by receiving an input signal (IN) from external. A gate insulating film 44-2 is provided between the gate electrode 42-2 and the front surface 12, and a gate insulating film 44-3 is provided between the gate electrode 42-3 and the front surface 12. The insulating film 80 is provided to directly contact the gate electrodes 42-2 and 42-3. The insulating film 80 is also provided on the separation region 30. The insulating film 80 has an opening 82 for connecting the barrier metal portion (the Ti film 72 and the TiN film 74) and the tungsten plug portion 76 to the source and drain regions. For the control circuit portion 200 as well, the same advantageous effect as that of the barrier metal portion in the power element portion 100 can be obtained.

In the present example, the shape of the tungsten portion 77 (the tungsten film 78) in the control circuit portion 200 is different from that in the power element portion 100. The tungsten film 78 in the control circuit portion 200 is electrically separated at a region between the source and drain in order to prevent short circuit between the source and drain. The tungsten film 78 in the present example is separated at a region above the gate electrodes 42-2 and 42-3.

Note that, in the present example as well, the tungsten portion 77 may include not only the tungsten plug portion 76 but also the tungsten film 78 provided in at least part of a region above the insulating film 80. The tungsten film 78 is not provided above a middle portion of the upper surface 88 of the insulating film 80 in order to prevent short circuit between the source and drain, and the tungsten film 78 may be provided above both end portions of the upper surface 88. As the tungsten film 78 having a higher hardness than the insulating film 80 and the upper electrode 54 is provided above a partial region of the insulating film 80, the insulating film 80 can be protected from the stress applied from above.

In the control circuit portion 200, current flows in the direction parallel to the front surface 12 of the semiconductor substrate 10. That is, in the control circuit portion 200, main current does not flow in the vertical direction (the upward/downward direction) but flows in the transverse direction (the direction perpendicular to the upward/downward direction). In the present example, the main current that flows in the transverse direction is referred to as transverse current. In the present example, the material of the wiring layer 56 is the same as that of the upper electrode 54.

The insulating film 81 is further provided on the tungsten portion 77 and the insulating film 80. The insulating film 81 has a plurality of openings 83. The wiring layer 56 containing the same material as that of the upper electrode 54 is provided to fill each of the plurality of the openings 83. Wiring layers 56-1 and 56-3 are connected to, respectively, an $n^+$-type well region 27-1 and a $p^+$-type well region 29-1. Also, wiring layers 56-2 and 56-4 are connected to, respectively, an $n^+$-type well region 27-2 and a $p^+$-type well region 29-2. The passivation film 90 is provided on the wiring layer 56 and the insulating film 81.

Figure 3:
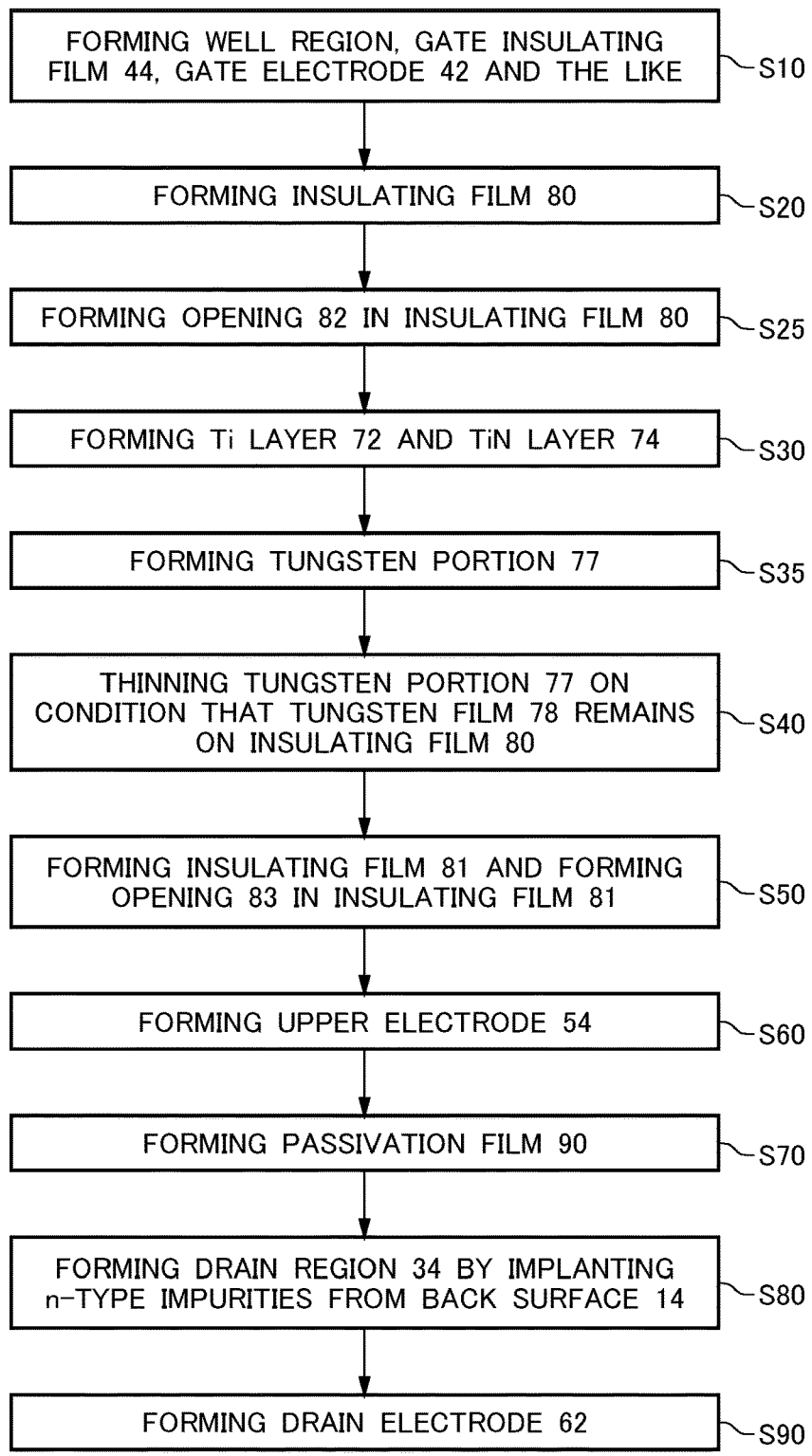
FIG. 3 is a flow diagram showing a manufacturing procedure of the semiconductor device 300.

FIG. 3 is a flow diagram showing a manufacturing procedure of the semiconductor device 300. In the present example, Steps S10 to S90 are performed in this order. A manufacturing method of the semiconductor device 300 in the present example includes: forming an n-type impurity implantation region such as a well region, a gate electrode 42, a gate insulating film 44 and the like (S10); forming an insulating film 80 (S20); forming an opening 82 in the insulating film 80 (S25); forming a barrier metal portion (S30); forming a tungsten portion 77 (S35); thinning the tungsten portion 77 on condition that the tungsten film 78 remains on the insulating film 80 (S40); forming an insulating film 81 and forming an opening 83 in the insulating film 81 (S50); forming an upper electrode 54 and a wiring layer 56 (S60); forming a passivation film 90 (S70); forming a drain region 34 by ion implantation (S80); and forming a drain electrode 62 (S90).

Figure 4A:
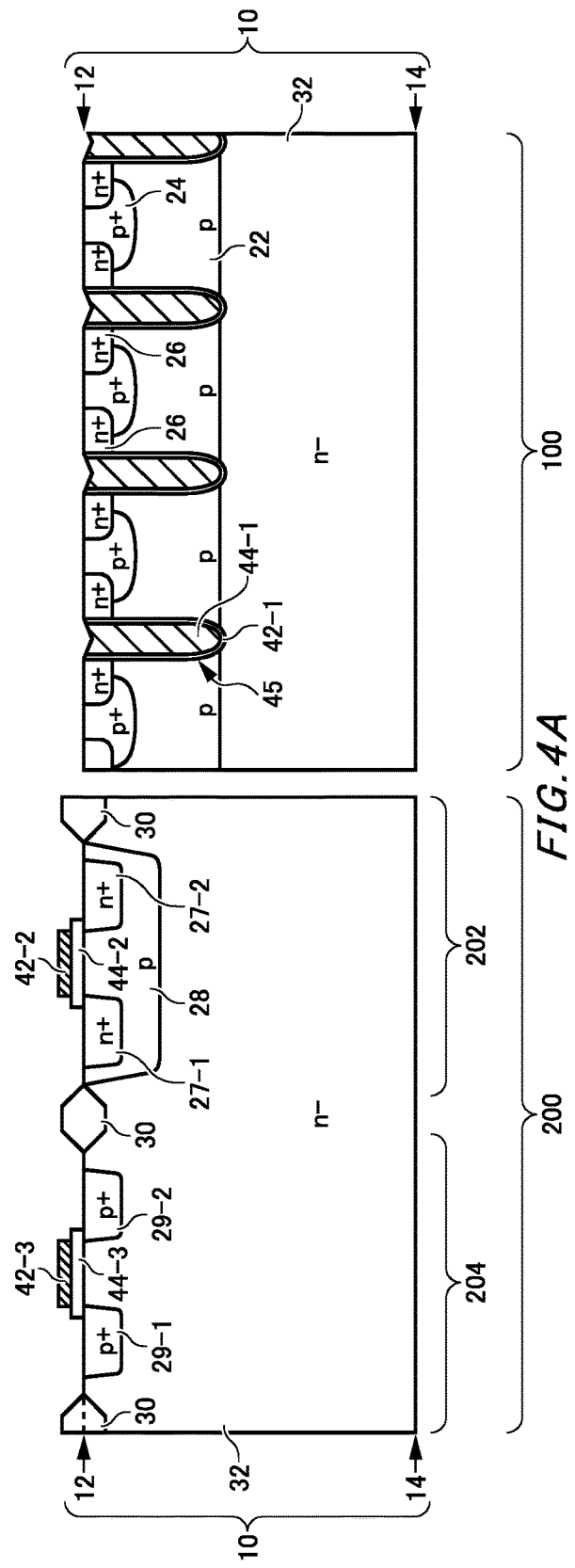
FIG. 4A is a cross-sectional view in Step S10.

FIG. 4A is a cross-sectional view in Step S10. In Step S10, a separation region 30 is formed by oxidization. Then, p-type impurities are ion-implanted into the semiconductor substrate 10. Then, n-type and p-type impurities are selectively ion-implanted into the semiconductor substrate 10. Subsequently, the semiconductor substrate 10 is thermally annealed. In this manner, a p-type base region 22, a p-type well region 28, an $n^+$-type source region 26, a $p^+$-type contact region 24, an $n^+$-type well region 27 and a $p^+$-type well region 29 are formed. Then, a gate insulating film 44 and a gate electrode 42 are formed.

Figure 4B:
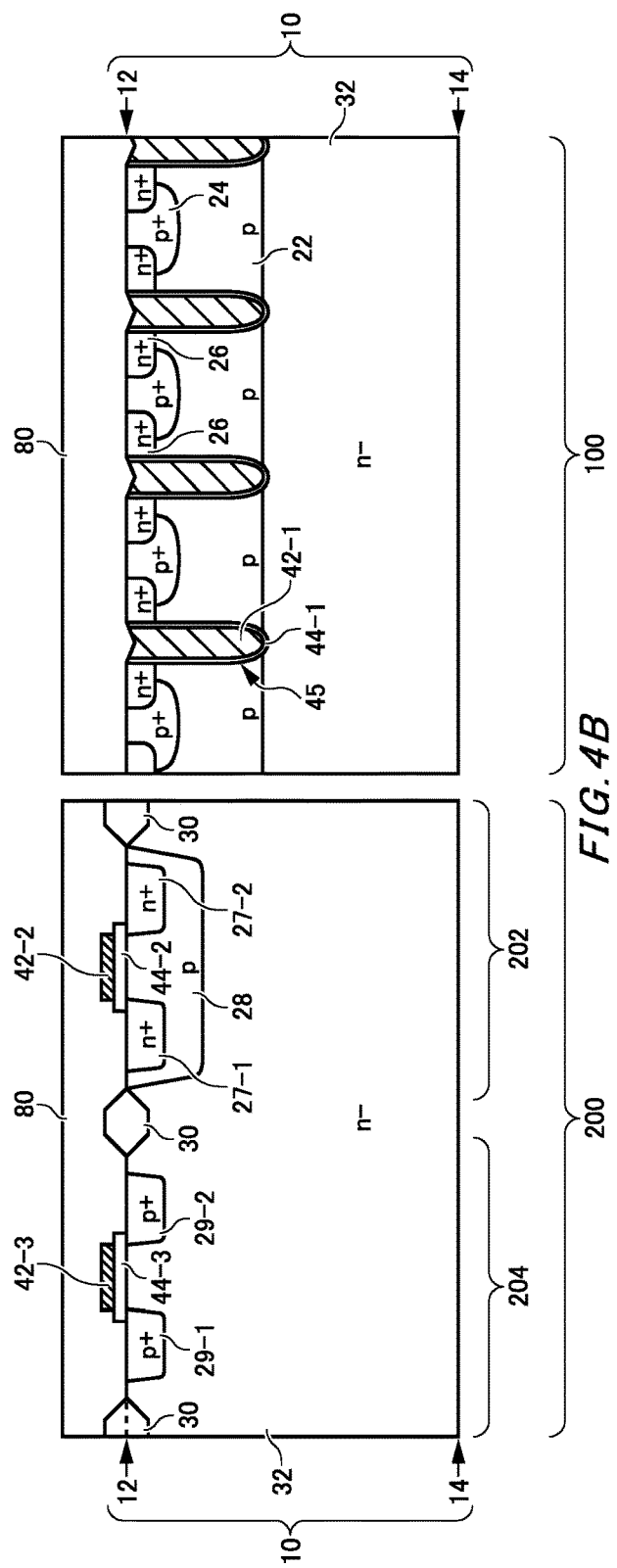
FIG. 4B is a cross-sectional view in Step S20.

FIG. 4B is a cross-sectional view in Step S20. In Step S20, an insulating film 80 is formed on the semiconductor substrate 10 by CVD (chemical vapor deposition). The insulating film 80 in the present example is BPSG.

Figure 4C:
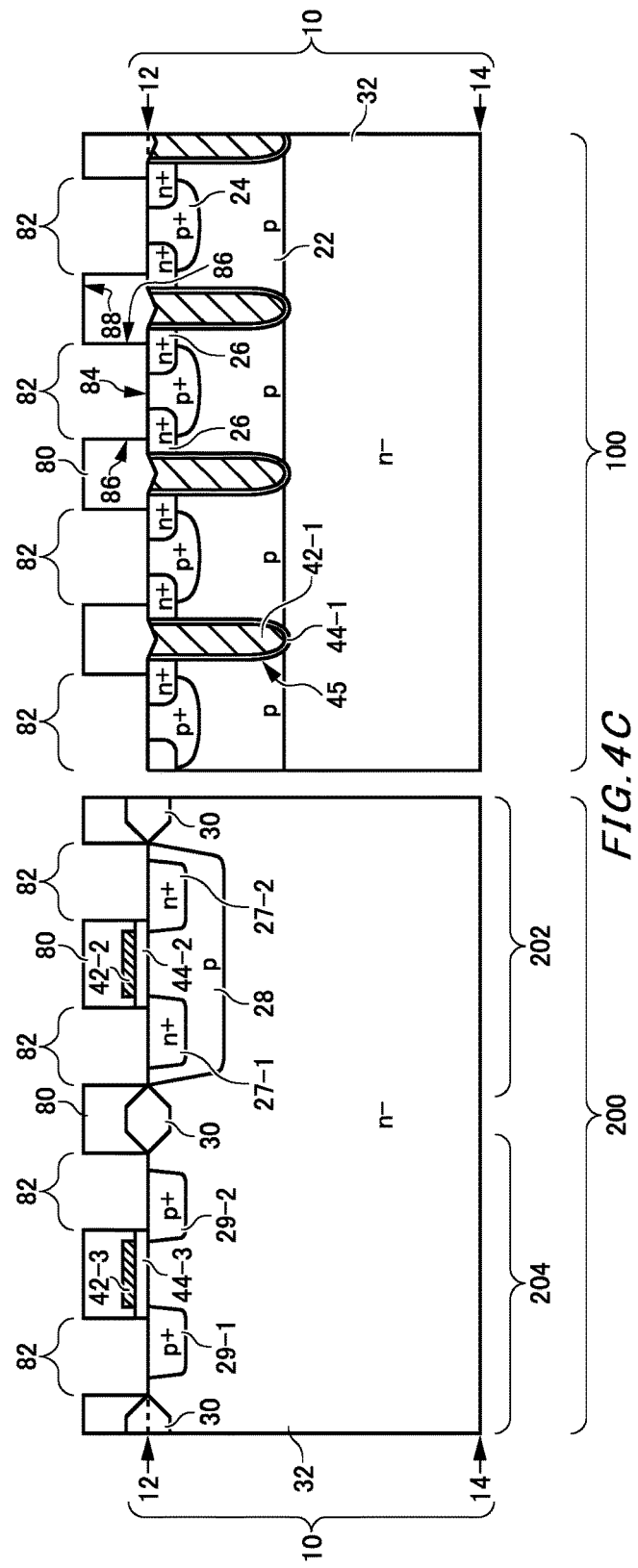
FIG. 4C is a cross-sectional view in Step S25.

FIG. 4C is a cross-sectional view in Step S25. In Step S25, one or more openings 82 that expose the semiconductor substrate 10 are formed in the insulating film 80 by etching the insulating film 80. The source region 26, the contact region 24, the $n^+$-type well region 27 and the $p^+$-type well region 29 in the semiconductor substrate 10 are exposed through the opening 82 in the insulating film 80. Known photolithography and etching processes may be used for the etching.

Figure 4D:
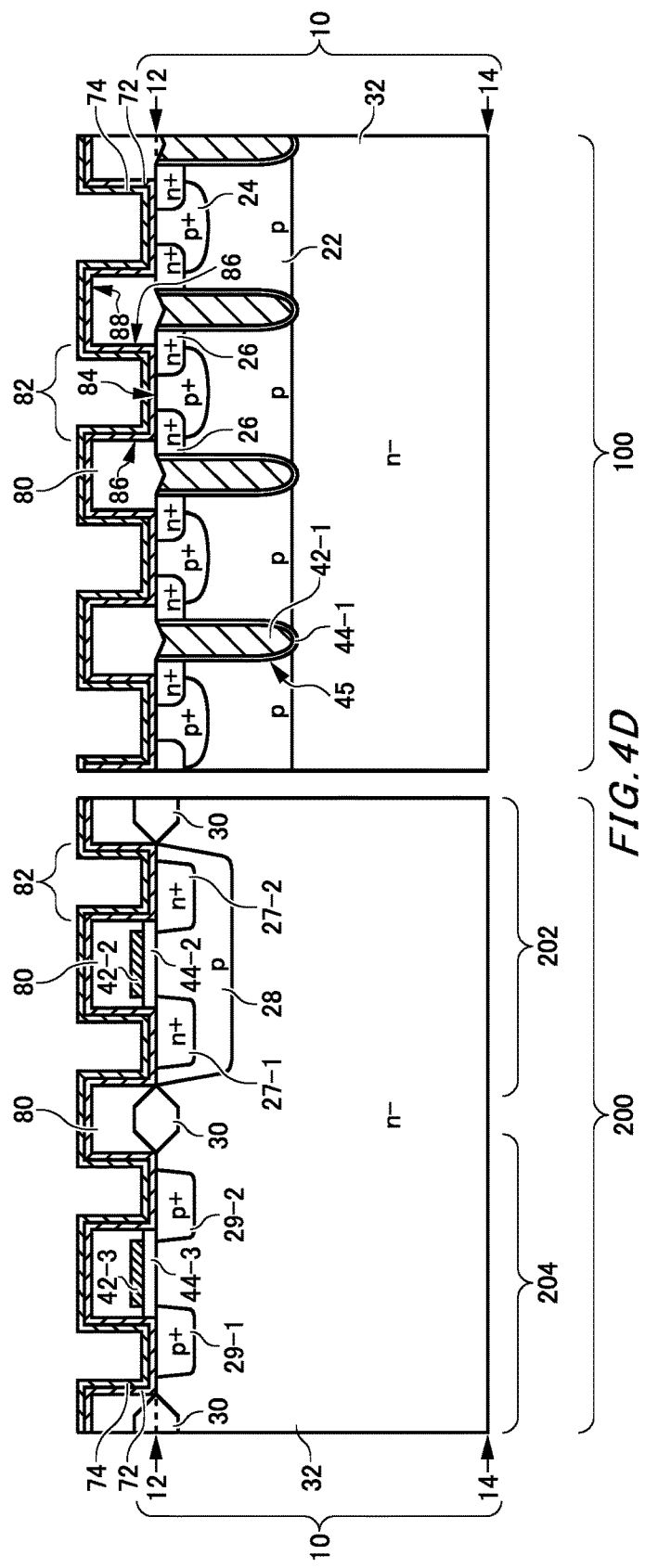
FIG. 4D is a cross-sectional view in Step S30.

FIG. 4D is a cross-sectional view in Step S30. In Step S30, a barrier metal portion is formed, by sputtering, on the bottom portion 84 of the opening 82, as well as on the side surface 86 and the upper surface 88 of the insulating film 80. In the present example, a Ti film 72 and a TiN film 74 are sequentially formed by sputtering. In the present example, the barrier metal portion is formed over the entire upper surface of the power element portion 100 and the control circuit portion 200.

Figure 4E:
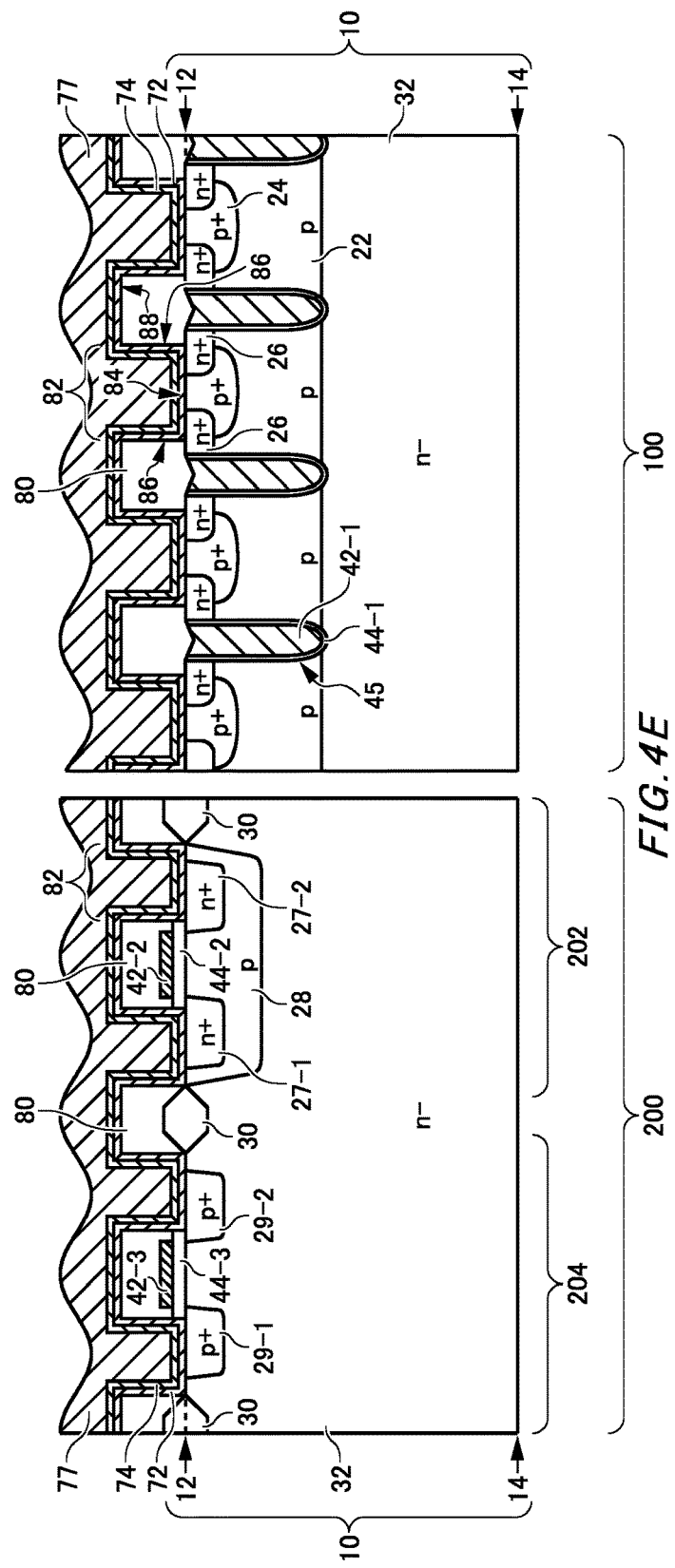
FIG. 4E is a cross-sectional view in Step S35.

FIG. 4E is a cross-sectional view in Step S35. In Step S35, a tungsten portion 77 deposited in the opening 82 and above the insulating film 80 is formed. The tungsten portion 77 is formed, by sputtering, on the entire upper surface of the barrier metal portion in the power element portion 100 and the control circuit portion 200. Note that the tungsten portion 77 may be formed by methods other than sputtering. In an example, the tungsten portion 77 may be formed by vapor-phase growth due to the reduction reaction of tungsten hexafluoride (hereinafter referred to as $WF_6$) and hydrogen.

The opening 82 in the insulating film 80 is filled with tungsten with the barrier metal portion interposed therebetween. If a plurality of openings 82 are provided in the insulating film 80, the thickness of the tungsten portion 77 above the openings 82 and the thickness of the tungsten portion 77 above regions other than the openings 82 may be different. The thickness of the tungsten portion 77 above the openings 82 may be formed to be smaller than the thickness of the tungsten portion 77 above regions other than the openings 82. In FIG. 4E, difference in the thickness of the tungsten film 78 depending on position is exaggeratedly shown.

Figure 4F:
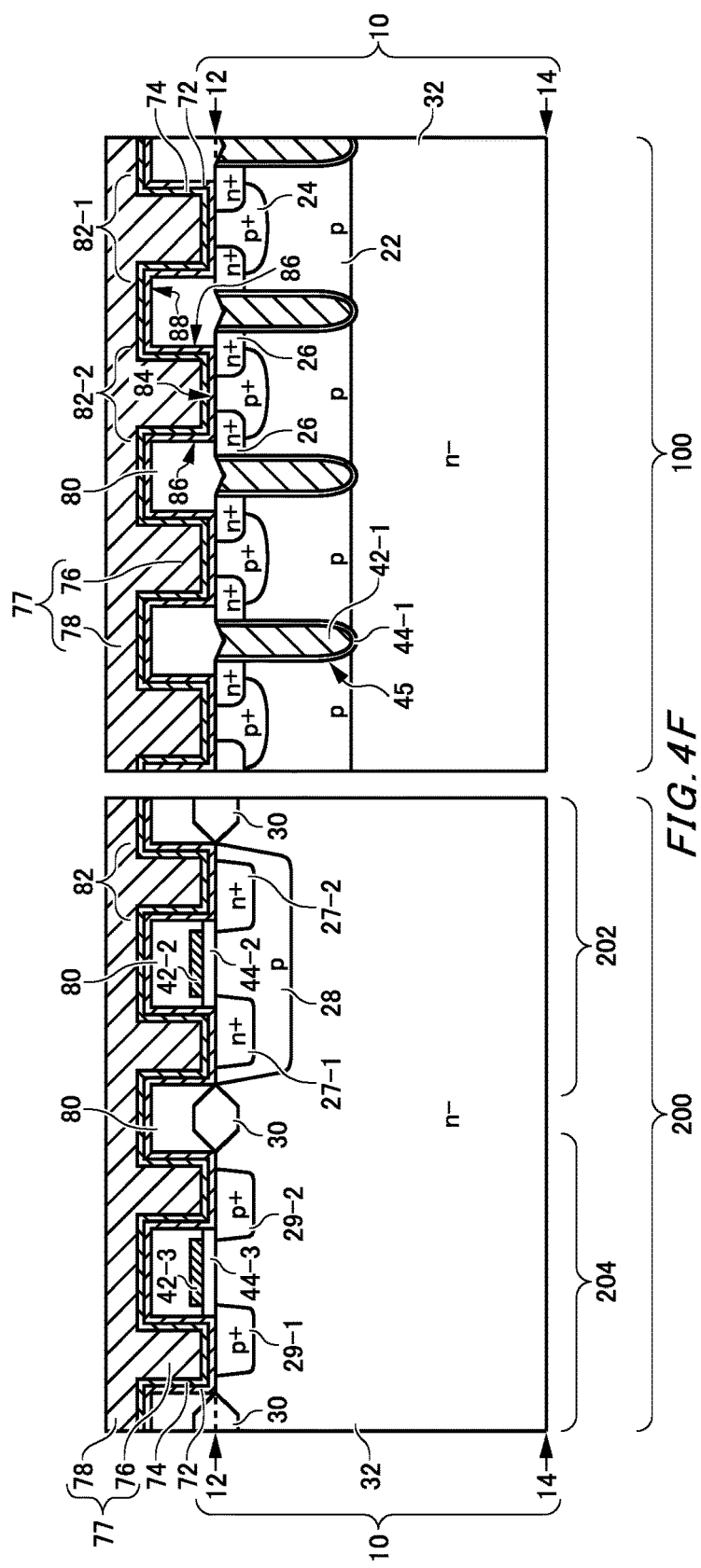
FIG. 4F is a cross-sectional view in Step S40.

FIG. 4F is a cross-sectional view in Step S40. In Step S40, the tungsten portion 77 is thinned on condition that the tungsten portion 77 remains in at least part of a region above the insulating film 80. The tungsten portion 77 remains above the insulating film 80 by setting a process condition when the laminated tungsten portion 77 is etched back.

In the present example, the barrier metal portion is formed on the insulating film 80, and therefore the tungsten film 78 is thinned on condition that the tungsten film 78 remains on the barrier metal portion. Thinning the tungsten portion may include planarizing the upper surface of the tungsten portion by chemical mechanical polishing (hereinafter referred to as CMP). The upper surface of the tungsten portion 77 is planarized by CMP, and therefore it becomes easy to perform laminating a conductive film in the post-process. Note that thinning the tungsten portion may include etching the upper surface of the tungsten portion 77 by processes other than CMP.

According to the present example, in thinning the tungsten portion 77, the tungsten portion 77 remains above the entire part of the insulating film 80 between the first opening 82-1 and the second opening 82-2 adjacent each other. In other words, according to the present example, the tungsten portion 77 above the insulating film 80 is not removed. In the present example, the barrier metal portion is provided on the insulating film 80. Accordingly, the tungsten film 78 positioned at the barrier metal portion on the upper surface 88 of the insulating film 80 is not removed and remains. In this manner, the tungsten portion 77 is formed such that the tungsten plug portion 76 in the opening 82 and the tungsten film 78 above the insulating film 80 are integrally coupled.

Figure 4G:
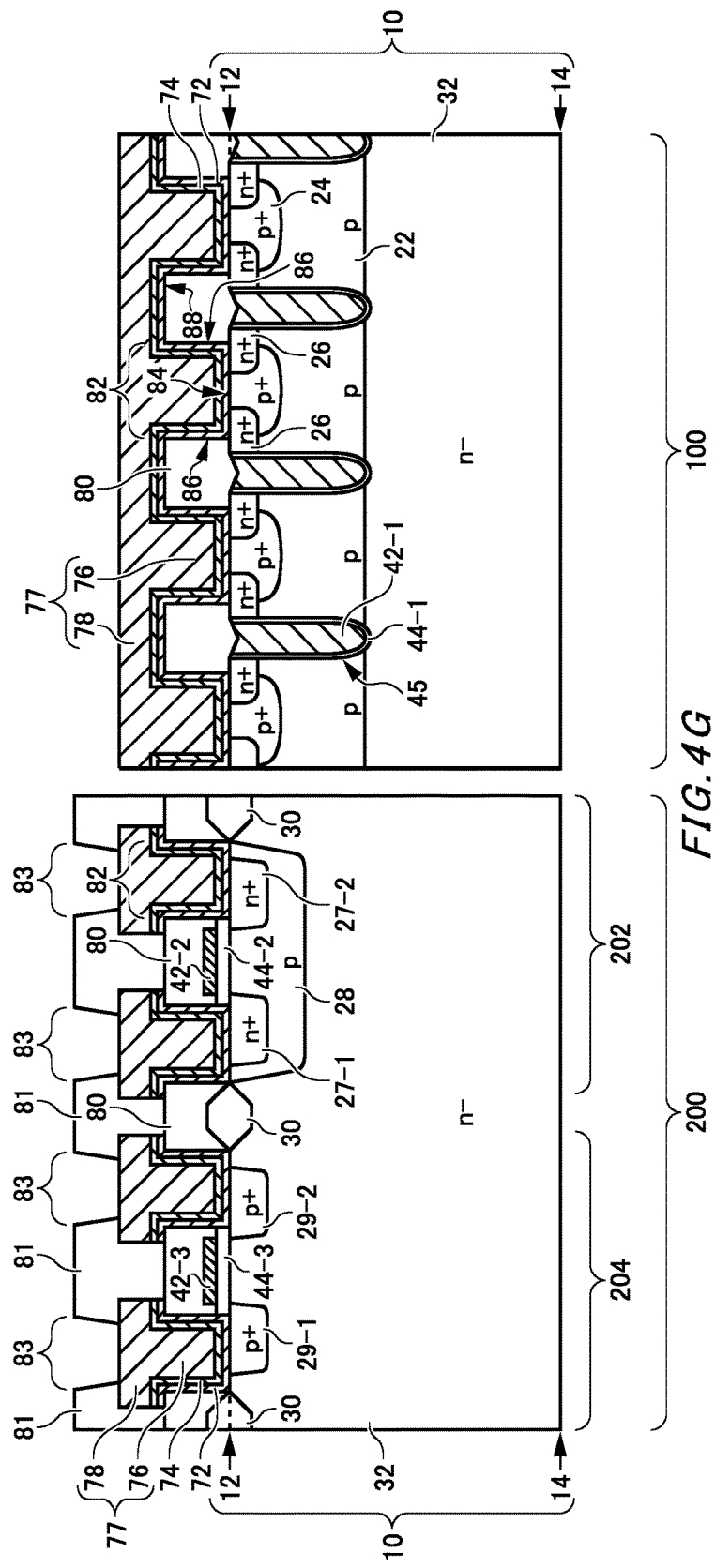
FIG. 4G is a cross-sectional view in Step S50.

FIG. 4G is a cross-sectional view in Step S50. In Step S50, an insulating film 81 having an opening 83 is formed only in the control circuit portion 200. For example, the insulating film 81 is first formed, by CVD, over the entire upper surface of the power element portion 100 and the control circuit portion 200. Subsequently, the insulating film 81 on the entire upper surface of the power element portion 100 and the insulating film 81 on the tungsten portion 77 in the control circuit portion 200 are removed by etching.

Figure 4H:
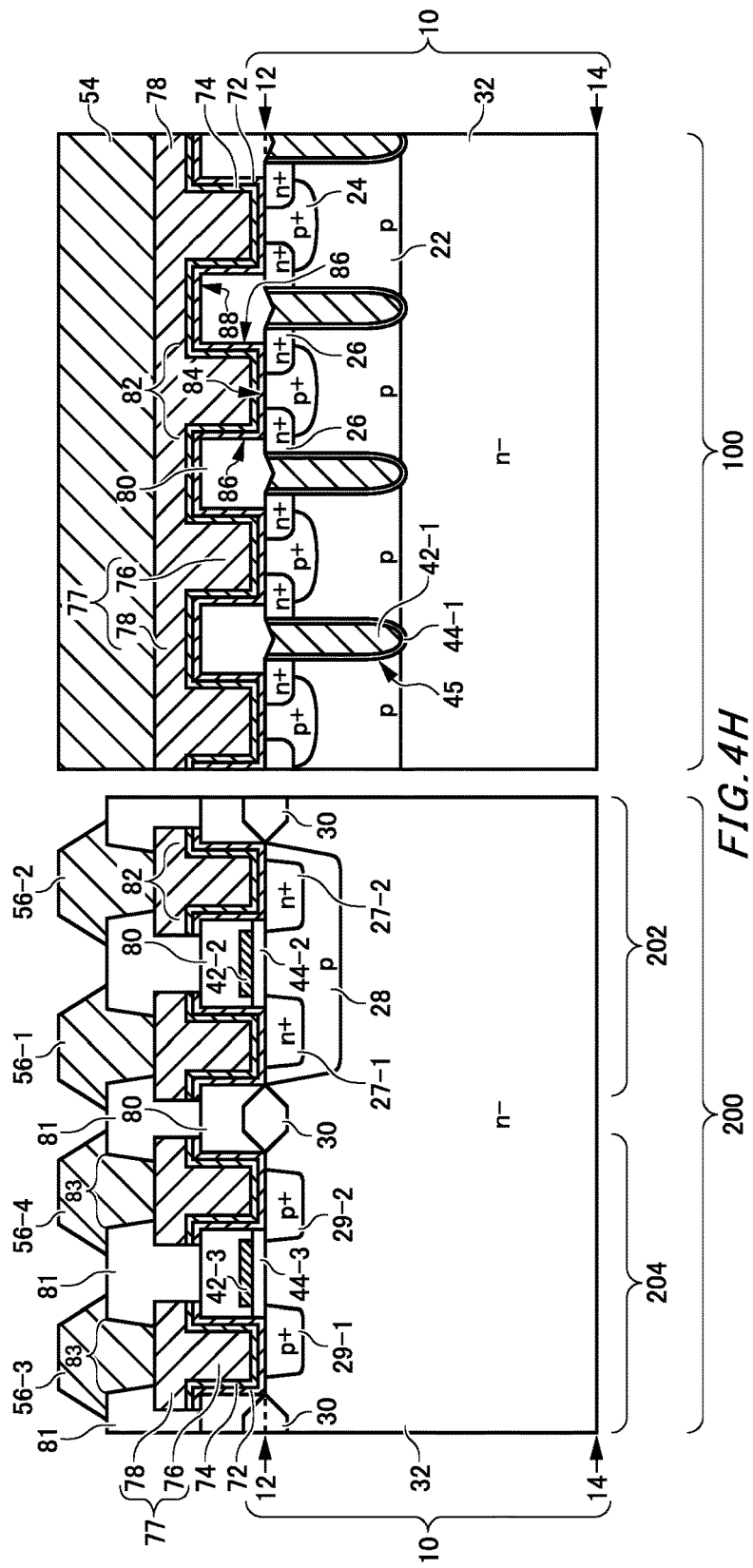
FIG. 4H is a cross-sectional view in Step S60.

FIG. 4H is a cross-sectional view in Step S60. In Step S60, an upper electrode 54 and a wiring layer 56 are formed on the tungsten portion 77 in the power element portion 100, and in the opening 83 and on the insulating film 81 in the control circuit portion 200. The upper electrode 54 and the wiring layer 56 may be integrally formed. The upper electrode 54 and the wiring layer 56 in the present example are an Al—Si—Cu film formed by sputtering. Then, the wiring layer 56 on the insulating film 81 in the control circuit portion 200 is patterned. The patterning allows adjacent parts of the wiring layer 56 to be electrically separated from each other. In this manner, the upper electrode 54 in the power element portion 100 and the wiring layer 56 in the opening 83 and on the insulating film 81 in the control circuit portion 200 are formed.

Figure 4I:
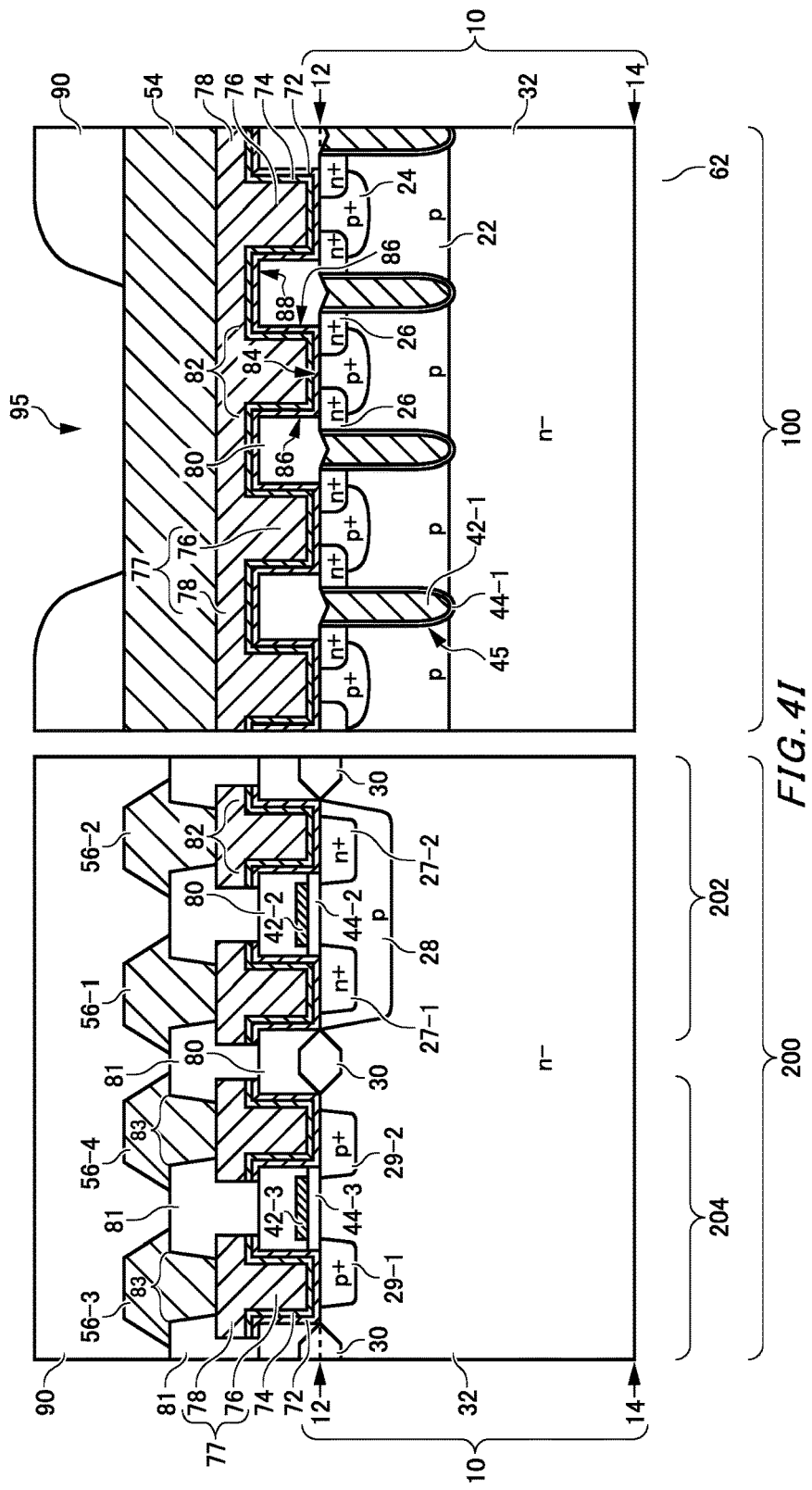
FIG. 4I is a cross-sectional view in Step S70.

FIG. 4I is a cross-sectional view in Step S70. In Step S70, a passivation film 90 is formed. The passivation film 90 may be a polyimide film formed by coating, or may be a silicon nitride film formed by CVD. Subsequently, the passivation film 90 is selectively etched to provide an opening 95.

Figure 4J:
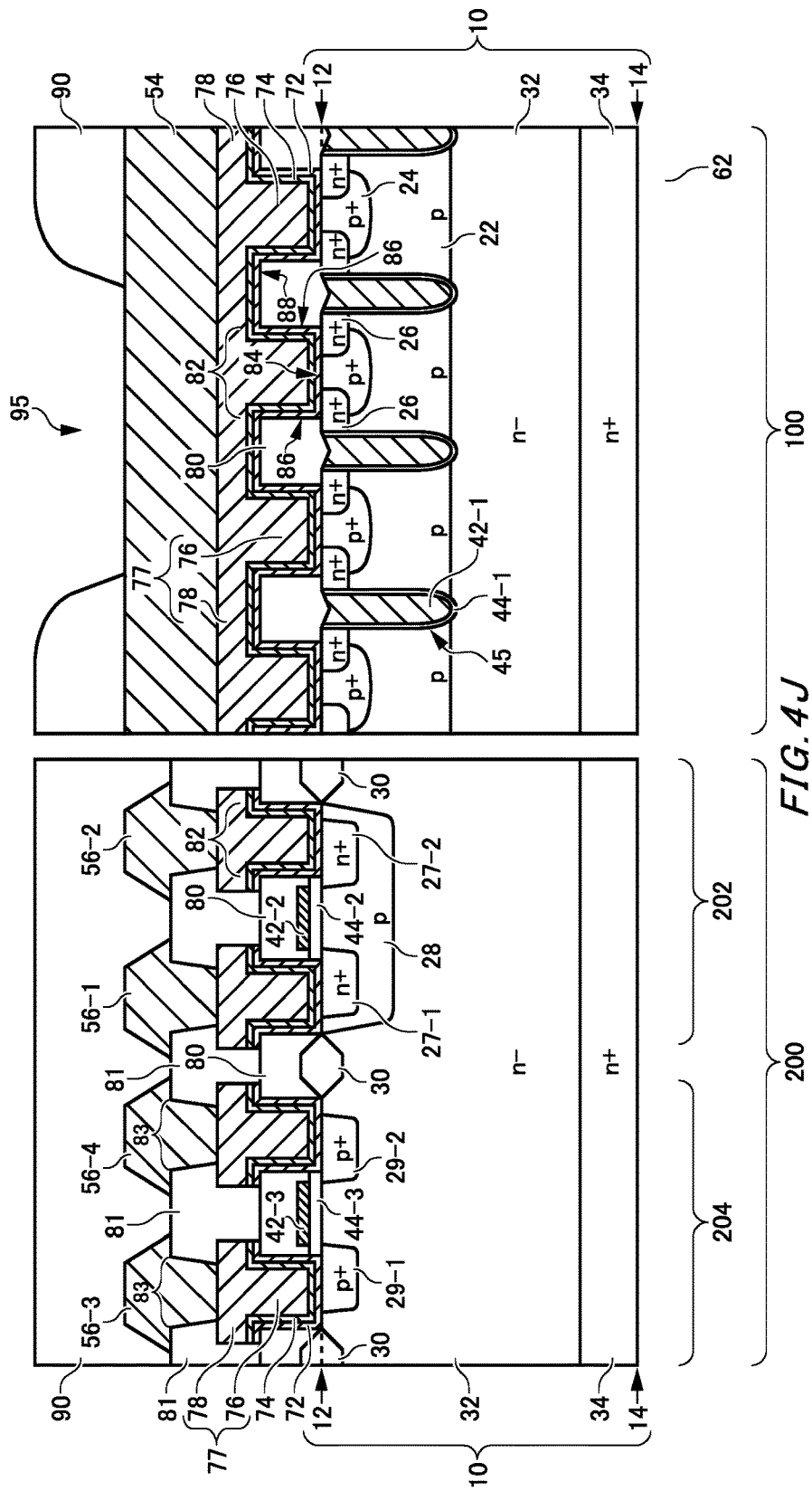
FIG. 4J is a cross-sectional view in Step S80.

FIG. 4J is a cross-sectional view in Step S80. In Step S80, n-type impurities are ion-implanted from the back surface 14. Note that n-type impurities are ion-implanted into the entire back surface 14 so that a drain region 34 may be formed in the control circuit portion 200. Subsequently, an n$^+$-type drain region 34 is formed by thermal annealing.

Figure 4K:
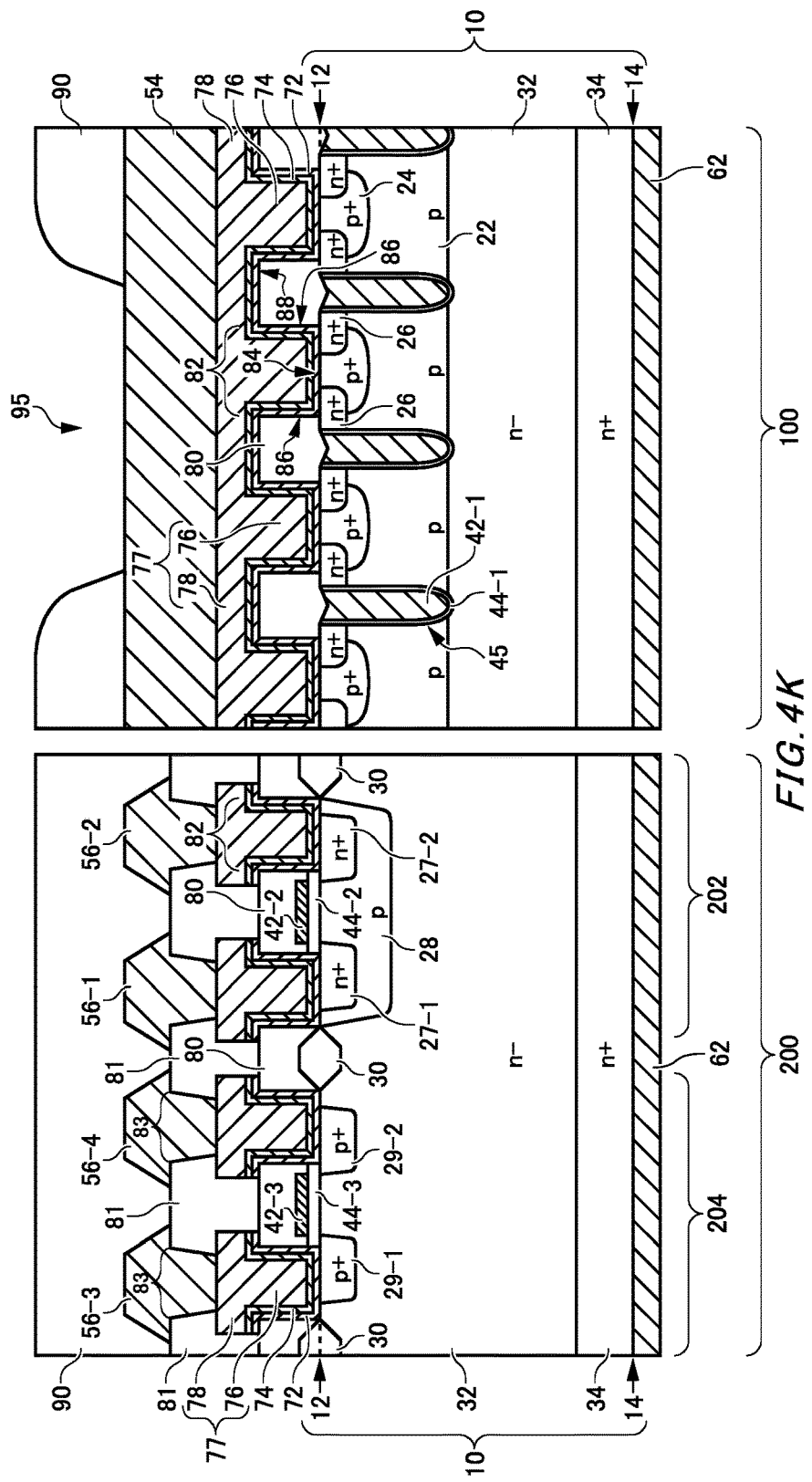
FIG. 4K is a cross-sectional view in Step S90.

FIG. 4K is a cross-sectional view in Step S90. In Step S90, a drain electrode 62 is formed by sputtering. The drain electrode 62 may include a Ti film that directly contacts the back surface 14 and an Al film that directly contacts the Ti film. Further, in the present example, the manufacturing method may further include bonding a wire 52 to the upper electrode 54 and/or soldering the wire 52 to the upper electrode 54.

As described above, according to the present example, the tungsten portion 77 provided above the insulating film 80, particularly the tungsten film 78, protects the insulating film 80 from the stress applied during the wire-bonding and soldering, and therefore the wire 52 and the solder 53 can be provided directly on the power element portion 100. Thus, the chip size of the semiconductor substrate 10 can be made smaller.

Figure 5:
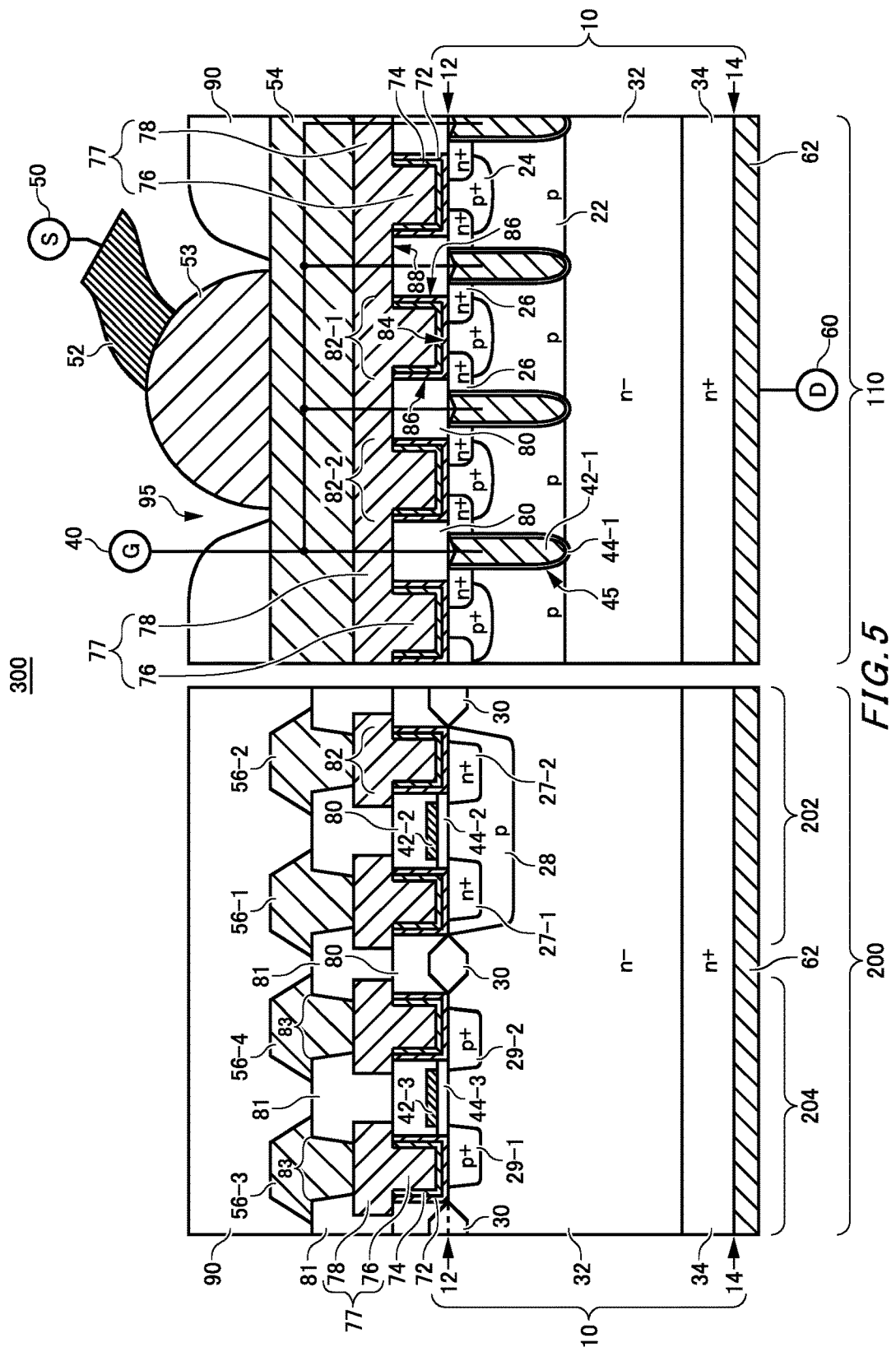
FIG. 5 is a cross-sectional view of the semiconductor device 300 in a second embodiment.

FIG. 5 is a cross-sectional view of the semiconductor device 300 in a second embodiment. In the power element portion 110 and the control circuit portion 200 in the present example, the barrier metal portion is not provided on the upper surface 88 of the insulating film 80. Accordingly, the tungsten film 78 directly contacts the upper surface 88 of the insulating film 80. The barrier metal portion includes a laminated film of the Ti film 72 and the TiN film 74, in a similar manner to the first embodiment. The Ti film 72 and the TiN film 74 in the present example may be provided on the bottom portion 84 of the opening 82 (that is, the front surface 12) and on the side portion of the opening 82 (that is, the side surface 86 of the insulating film 80). The present example is similar to the first embodiment in the other points.

According to the present example, the Ti film 72 is not provided on the upper surface 88 of the insulating film 80 containing oxygen, and therefore a TiO$_2$ layer is not formed on the insulating film 80. Thus, structures on the insulating film 80 can be prevented from peeling off. In this manner, the operation reliability of the semiconductor device 300 can be enhanced compared to the case where the Ti film 72 is provided on the insulating film 80.

Unlike the present example, the Ti film 72 and the TiN film 74 may be provided only on the bottom portion 84 of the opening 82 (that is, the front surface 12), or the Ti film 72 and the TiN film 74 may be provided only on the side portion of the opening 82 (that is, the side surface 86 of the insulating film 80). Otherwise, the Ti film 72 and the TiN film 74 may not be formed.

Figure 6:
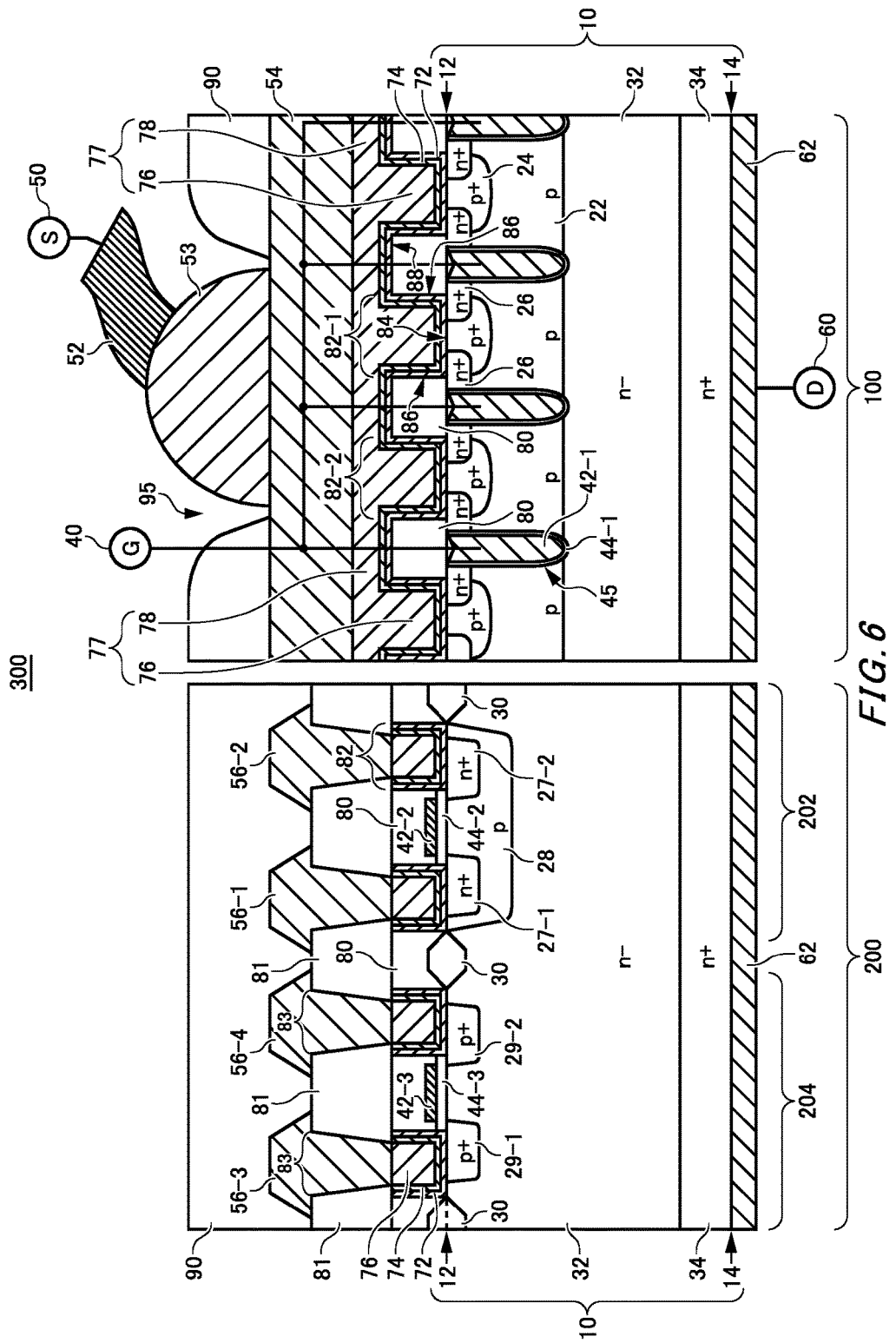
FIG. 6 is a cross-sectional view of the semiconductor device 300 in a third embodiment.

FIG. 6 is a cross-sectional view of the semiconductor device 300 in a third embodiment. In the present example, the tungsten portion 77 is not provided above the insulating film 80 in the control circuit portion 200. Specifically, the control circuit portion 200 includes only the tungsten plug portion 76 provided in the opening 82, and does not include the tungsten film 78 provided on the insulating film 80. Accordingly, the entire region of the upper surface 88 of the insulating film 80 may contact the insulating film 81.

On the other hand, in the power element portion 100, the tungsten portion 77 is provided in at least part of a region above the insulating film 80, in a similar manner to the first embodiment shown in FIG. 2 and the second embodiment shown in FIG. 5. In the present example, the Ti film 72 and the TiN film 74 are provided, as the barrier metal portion, on the upper surface 88 of the insulating film 80. Accordingly, the tungsten film 78 is provided in contact with the upper surface of the barrier metal portion. Note that, in a similar manner to the second embodiment in FIG. 5, the barrier metal portion may not be formed on the upper surface 88 of the insulating film 80. In this case, the tungsten film 78 directly contacts the upper surface 88 of the insulating film 80. The present example is similar to the first embodiment or the second embodiment in the other points.

Figure 7:
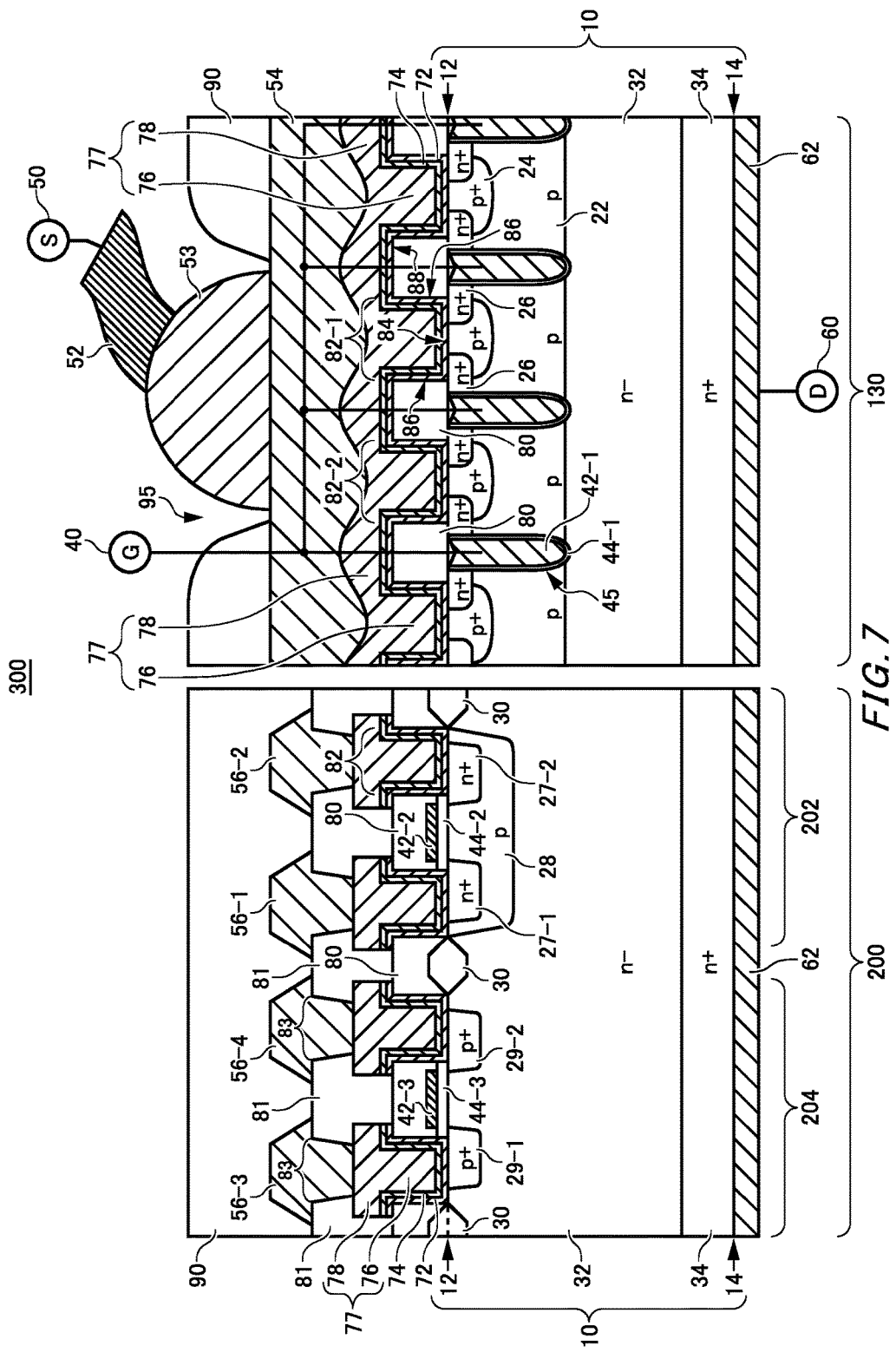
FIG. 7 is a cross-sectional view of the semiconductor device 300 in a fourth embodiment.

FIG. 7 is a cross-sectional view of the semiconductor device 300 in a fourth embodiment. According to the present example, in the power element portion 130, the upper surface of the tungsten portion 77 is formed to be uneven. The upper surface of the tungsten portion 77 may be formed to have a wave-like shape. The thickness of the tungsten film 78 measured in the upward direction from the upper surface 88 of the insulating film 80 varies with position. The thickness of the tungsten film 78 measured upward from the upper surface 88 of the insulating film 80 is such that the thickness above the opening 82 is smaller than the thickness above regions other than the opening 82.

The upper electrode 54 is provided on the tungsten portion 77 having the uneven upper surface. Accordingly, the interface between the upper electrode 54 and the tungsten portion 77 is formed to be uneven, so that the surface area in which the upper electrode 54 and the tungsten portion 77 are in contact with each other can be increased. Accordingly, adhesiveness between the tungsten portion 77 and the upper electrode 54 can be enhanced.

An example of the manufacturing method of the semiconductor device 300 in the present example will be described. In the first embodiment, as shown in FIG. 4E, when the tungsten portion 77 is formed, the thickness of the tungsten portion 77 above the opening 82 and the thickness of the tungsten portion 77 above regions other than the opening 82 are different. Accordingly, when performing etchback of the tungsten portion 77, etching the tungsten portion 77 without planarizing by CMP allows the upper surface of the tungsten portion 77 to remain to have the wave-like unevenness. Note that the manufacturing method is not limited to this case.

Figure 8:
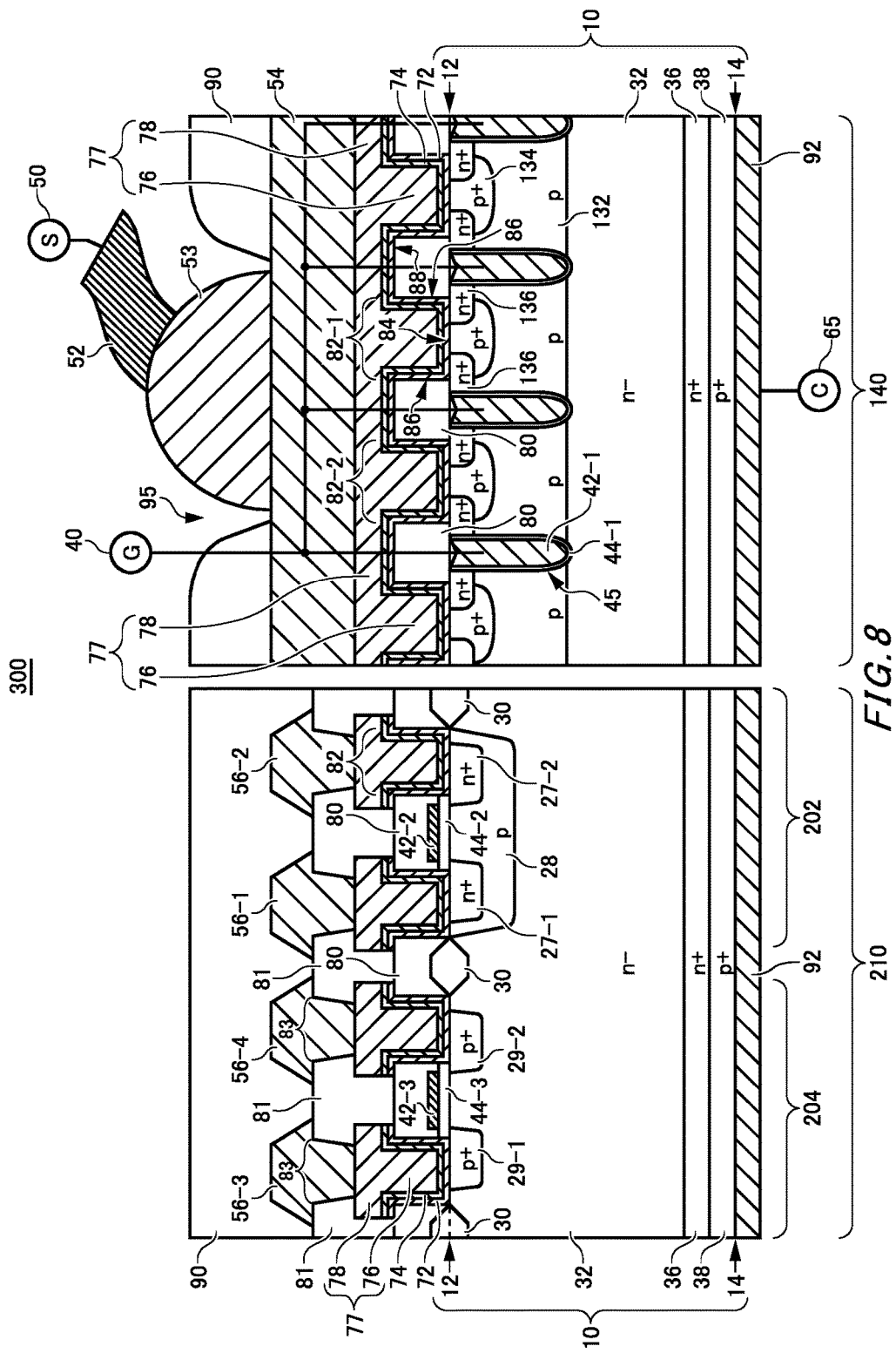
FIG. 8 is a cross-sectional view of the semiconductor device 300 in a fifth embodiment.

FIG. 8 is a cross-sectional view of the semiconductor device 300 in a fifth embodiment. A power element portion 140 in the present example is not a vertical MOSFET but a vertical IGBT. Also, the control circuit portion 210 is a planar-gate lateral MOSFET. Also, the base region 22, the contact region 24 and the source region 26 in the first embodiment correspond to, respectively, a base region 132, a contact region 134 and an emitter region 136. The semiconductor substrate 10 in the power element portion 140 in the present example includes a collector layer 38 on the back surface 14 side. The collector layer 38 has a predetermined thickness measured in the upward direction from the back surface 14. The collector layer 38 in the present example is a p$^+$-type region. Further, the semiconductor substrate 10 in the power element portion 140 in the present example includes a field stop (hereinafter referred to as FS) layer 36 on the collector layer 38. The FS layer 36 has a predetermined thickness measured in the upward direction from the upper end of the collector layer 38. The FS layer 36 in the present example is an n$^+$-type region. Also, the power element portion 140 in the present example includes a collector electrode 92 under the back surface 14. A collector portion 65 is connected to the collector electrode 92. The circled letter C in FIG. 8 refers to the collector portion 65. The present example is different from the first embodiment in those points. The present example is the same as the first to fourth embodiments in the other points.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 12: front surface, 14: back surface, 22: base region, 24: contact region, 26: source region, 27: n$^+$-type well region, 28: p-type well region, 29: p$^+$-type well region, 30: separation region, 32: drift region, 34: drain region, 36: FS layer, 38: collector layer, 40: gate portion, 42: gate electrode, 44: gate insulating film, 45: trench portion, 50: source portion, 52: wire, 53: solder, 54: upper electrode, 56: wiring layer, 60: drain portion, 62: drain electrode, 65: collector portion, 72: Ti film, 74: TiN film, 76: tungsten plug portion, 77: tungsten portion, 78: tungsten film, 80: insulating film, 81: insulating film, 82: opening, 83: opening, 84: bottom portion, 86: side surface, 88: upper surface, 90: passivation film, 92: collector electrode, 95: opening, 100: power element portion, 110: power element portion, 130: power element portion, 132: base region, 134: contact region, 136: emitter region, 140: power element portion, 200: control circuit portion, 202: NMOS region, 204: PMOS region, 210: control circuit portion, 300: semiconductor device

What is claimed is:

1. A semiconductor device, comprising:
a semiconductor substrate;
an insulating film provided on the semiconductor substrate, and having one or more openings that expose the semiconductor substrate;
a tungsten portion filling the openings and provided in at least part of a region above the insulating film; and
an upper electrode provided above the tungsten portion, wherein
the upper electrode comprises a wire-bonding region to which wiring is bonded; and
the tungsten portion is provided at least below the wire-bonding region.

2. The semiconductor device according to claim 1, wherein:
the openings comprise a first opening and a second opening that each expose the semiconductor substrate; and
the tungsten portion is provided above an entire part of the insulating film between the first opening and the second opening.

3. The semiconductor device according to claim 1, further comprising a barrier metal portion provided on a bottom portion and a side portion of the openings, and having one or more types of films that are laminated.

4. The semiconductor device according to claim 3, wherein:
the barrier metal portion is also provided on an upper surface of the insulating film;
the tungsten portion is provided in contact with an upper surface of the barrier metal portion; and
the upper electrode is provided in contact with an upper surface of the tungsten portion.

5. The semiconductor device according to claim 3, wherein a thickness of the tungsten portion in a region above the insulating film is greater than a thickness of the barrier metal portion.

6. A semiconductor device comprising:
a semiconductor substrate;
an insulating film provided on the semiconductor substrate, and having one or more openings that expose the semiconductor substrate;
a tungsten portion filling the openings and provided in at least part of a region above the insulating film;
an upper electrode provided above the tungsten portion;
a power element portion and a control circuit portion are provided to the semiconductor substrate;
in the power element portion, the tungsten portion is provided in at least part of a region above the insulating film; and
in the control circuit portion, the tungsten portion is not provided above the insulating film.

7. The semiconductor device according to claim 6, wherein:
the openings comprise a first opening and a second opening that each expose the semiconductor substrate; and
the tungsten portion is provided above an entire part of the insulating film between the first opening and the second opening.

8. The semiconductor device according to claim 6, further comprising a barrier metal portion provided on a bottom portion and a side portion of the openings, and having one or more types of films that are laminated.

9. The semiconductor device according to claim 8, wherein:
the barrier metal portion is also provided on an upper surface of the insulating film;
the tungsten portion is provided in contact with an upper surface of the barrier metal portion; and
the upper electrode is provided in contact with an upper surface of the tungsten portion.

10. The semiconductor device according to claim 8, wherein a thickness of the tungsten portion in a region above the insulating film is greater than a thickness of the barrier metal portion.

\* \* \* \* \*